(12) United States Patent  
Haluska

(10) Patent No.: US 6,171,703 B1
(45) Date of Patent: Jan. 9, 2001

(54) HERMETIC SUBSTRATE COATINGS IN AN INERT GAS ATMOSPHERE

(75) Inventor: Loren Andrew Haluska, Midland, MI (US)

(73) Assignee: Dow Corning Corporation, Midland, MI (US)

(*) Notice: Under 35 U.S.C. 154(b), the term of this patent shall be extended for 0 days.

(21) Appl. No.: 08/293,331

(22) Filed: Aug. 22, 1994

Related U.S. Application Data

(62) Division of application No. 08/077,469, filed on Jun. 15, 1993, now Pat. No. 5,380,567, which is a continuation of application No. 07/683,908, filed on Apr. 11, 1991, now abandoned, which is a continuation of application No. 07/423,317, filed on Oct. 18, 1989, now abandoned.

(51) Int. Cl.⁷ .......................... B32B 18/00; B32B 15/20; B05D 3/02
(52) U.S. Cl. ...................... 428/446; 427/228; 427/407.1; 427/419.8; 427/489; 427/497; 427/503; 428/450; 428/469; 428/433; 428/434; 428/698
(58) Field of Search .................. 428/698, 702, 428/704, 446, 448, 450, 469, 432, 433, 434; 427/226, 228, 377, 397.7, 489, 497, 503, 419.8, 407.1

(56) References Cited

U.S. PATENT DOCUMENTS

| | | | |
|---|---|---|---|
| 4,749,631 | * 6/1988 | Haluska | 428/704 |
| 4,753,855 | * 6/1988 | Haluska | 428/702 |
| 4,753,856 | * 6/1988 | Haluska | 428/698 |
| 4,756,977 | * 7/1988 | Haluska | 428/704 |
| 4,822,697 | * 4/1989 | Haluska | 428/698 |
| 4,826,733 | * 5/1989 | Haluska | 428/447 |
| 5,336,364 | * 8/1994 | Takahama | 156/630 |
| 5,370,904 | * 12/1994 | Mine | 427/126.2 |

\* cited by examiner

Primary Examiner—Ellis Robinson
(74) Attorney, Agent, or Firm—Roger E. Gobrogge; Rick D. Streu

(57) ABSTRACT

The present invention relates to a method of forming a ceramic or ceramic-like coating on a substrate in the absence of oxygen. The method comprises coating the substrate with a solution comprising a solven and one or more preceramic materials selected from the group consisting of hydrogen silsesquioxane and hydrolyzed or partially hydrolyzed $R_xSi(OR)_{4-x}$ wherein R is independently selected from the group consisting of alkyl, aryl and unsaturated hydrocarbons and x is 0–2. The solvent is evaporated and a preceramic coating thereby deposited on the substrate. The preceramic coating is then ceramified by heating the coated substrate to a temperature of between about 500 up to about 1000° C. under an inert gas atmosphere to thereby produce a ceramic or ceramic-like coating on the substrate. The process of the invention is useful for forming protective coatings on any substrate prone to oxidation at the temperature necessary for ceramification. The present invention also relates to the formation of additional ceramic coatings on the ceramic or ceramic-like coating formed above.

4 Claims, No Drawings

HERMETIC SUBSTRATE COATINGS IN AN INERT GAS ATMOSPHERE

This is a divisional Ser. No. 08/077,469 filed on Jun. 15, 1993 now U.S. Pat. No. 5,380,567 which is a continuation of Ser. No. 07/683,908 filed Apr. 11, 1991, abn which is a continuation of Ser. No. 07/423,317 filed Oct. 18, 1989 abn.

FIELD OF INVENTION

This invention relates to the protection of substrates such as electronic devices with surface-applied ceramic coatings of materials such as amorphous silica, silicon, silicon carbide, silicon nitride and silicon carbonitride.

BACKGROUND OF THE INVENTION

Electronic devices, to be serviceable under a wide variety of environmental conditions, must be able to withstand moisture, heat and abrasion, among other stresses. A significant amount of work has been reported directed toward various protective measures to minimize the exposure of these devices to the above conditions and thereby increase their reliability and life. Most of these measures, however, suffer from various drawbacks.

For instance, early measures involved potting electronics within a polymeric resin and, thereby, reducing environmental exposure. These methods proved to be of limited value, however, since most resins are not impermeable to environmental moisture and they generally add extra size and weight.

A second method of protection involves sealing the device within a ceramic package. This process has proven to be relatively effective in increasing device reliability and is currently used in select applications. The added size, weight and cost involved in this method, however, inhibits widespread application in the electronic industry.

Recently, the use of lightweight ceramic coatings has been suggested. For instance, Haluska et al. in U.S. Pat. Nos. 4,749,631 and 4,753,856, which are incorporated herein in their entirety by reference, disclose silicon containing coatings produced by applying solutions of silicon alkoxides or silicon alkoxides and metal oxide precursors, respectively, to an electronic device and then ceramifying in air by heating to temperatures of 200–1000° C. These references also describe the application of other coatings containing silicon carbon, silicon nitrogen or silicon carbon nitrogen onto the initial silica layer for added protection. The ceramic coatings produced thereby have many desirable characteristics such as microhardness, moisture resistance. ion barrier, adhesion, ductility, tensile strength and thermal expansion coefficient matching which provide excellent protection to the underlying substrate.

Haluska et al. in U.S. Pat. Nos. 4,756,977, 4,753,855 and 4,822,697 also disclose light-weight ceramic coatings for electronics obtained from hydrogen silsesquioxane resin (H-resin), H-resin with a metal oxide precursor and H-resin with a platinum catalyst, respectively. The process comprises dissolving the H-resin, H-resin and metal oxide, or H-resin and the catalyst in a solvent, evaporating the solvent, and ceramifying in air at temperatures in the range of 200–1000° C. The silica coating may be further coated with additional layers of silicon carbon, silicon nitrogen or silicon carbon nitrogen.

As noted, the above ceramic coating processes involve heating the electronic devices to temperatures of 200–1000° C. in an atmosphere containing oxygen. When certain metals within the devices are exposed to these conditions, however, they begin to deteriorate through oxidation. For instance, when copper is heated to temperatures above 200–250° C. in the presence of oxygen, it oxidizes to CuO which destroys the integrity of the metal and, thus, the electronic device. Moreover, if one attempts to avoid the above destructive effects by keeping the temperature below the oxidation threshold, ceramification takes so long that the process is not commercially feasible.

Wagner et al. in Industrial and Engineering Chemistry, 44(2), 321–326 (1952) reported heating H-resin (silicon oxyhydride) at temperatures as low as 350° C. in an inert atmosphere and observing hydrogen evolution. This reference, however, does not disclose the utility of applying a coating to a substrate under said conditions.

Glasser et al. in J. Non-crystalline Solids, 63 (1984), 209–221, reported applying a nitrided silica coating on a silicon wafer by heating a hydrolyzed solution of tetraethoxysilane in a flowing nitrogen or ammonia atmosphere. This reference, however, discloses that a significant amount of nitrogen from the atmosphere was incorporated into said coating.

Haluska et al. in U.S. Pat. No. 4,826,733 teach the formation of silicon nitride ceramic coatings on electronic devices in an oxygen free environment. The process disclosed therein is a low temperature method whereby a planarizing or passivating coating is formed by dissolving a silicon nitride compound in a solvent, coating the substrate with said solution, evaporating the solvent and ceramifying by heating to temperatures of 200–400° C. in the absence of air. This reference, however, does not teach the use of silicon compounds other than those containing nitrogen.

The present inventors have now discovered that they can apply a ceramic or ceramic-like coating from materials selected from the group consisting of hydrogen silsesquioxane resin or hydrolyzed or partially hydrolyzed $R_xSi(OR)_{4-x}$, wherein R is independently selected from the group consisting of alkyl, aryl and unsaturated hydrocarbons and x is 0–2, in an inert gas atmosphere at temperatures of 500–1000° C.

SUMMARY OF THE INVENTION

The present invention relates to a method of forming a ceramic or ceramic-like coating on a substrate in the absence of oxygen. The method comprises coating the substrate with a solution comprising a solvent and one or more preceramic materials selected from the group consisting of hydrogen silsesquioxane resin (H-resin) and hydrolyzed or partially hydrolyzed $R_xSi(OR)_{4-x}$ wherein R is independently selected from the group consisting of alkyl, aryl and unsaturated hydrocarbons and x is 0–2. The solvent is evaporated and a preceramic coating thereby deposited on the substrate. The preceramic coating is then ceramified by heating the coated substrate to a temperature of between about 500 up to about 1000° C. under an inert gas atmosphere to thereby produce a ceramic or ceramic like coating on the substrate.

The process of the invention is useful for forming protective coatings on any substrate prone to oxidation at the temperature necessary for ceramification. In particular, however, the process is advantageous for sealing electronic devices which contain copper or other metals subject to oxidation.

The present invention also relates to the formation of additional ceramic coatings on the coating formed above. In a dual layer system, the second passivation layer may comprise silicon containing coatings, silicon carbon-containing coatings, silicon nitrogen-containing coatings, silicon carbon nitrogen containing coatings or an additional coating as formed above. In a triple layer system, the second passivation layer may comprise silicon carbon-containing coatings, silicon nitrogen-containing coatings, silicon carbon nitrogen containing coatings or an additional coating as formed above and the third barrier coating may comprise silicon coatings, silicon carbon-containing coatings, silicon nitrogen-containing coatings, and silicon carbon nitrogen containing coatings.

The additional coating layers described above may be deposited using a number of techniques including, but not limited to, chemical vapor deposition, plasma enhanced chemical vapor deposition, metal assisted chemical vapor deposition and/or ceramification of a preceramic polymer.

DETAILED DESCRIPTION OF THE INVENTION

The instant invention is based on the discovery that materials selected from the group consisting of H-resin and hydrolyzed or partially hydrolyzed $R_xSi(OR)_{4-x}$ can be converted to ceramic or ceramic-like coatings in an inert gas atmosphere at temperatures of about 500–1000° C. Since the ceramification of such preceramic materials had previously been effected by heating in reactive atmospheres such as air or ammonia, the discovery that ceramic or ceramic-like coatings could be formed in an inert atmosphere was unexpected. Similarly it was unexpected that coatings formed in an inert atmospheres would have utility as protective coatings for electronic devices.

The invention also relates to the discovery that the above coatings of this invention can be overcoated with additional silicon, silicon nitrogen, silicon carbon or silicon carbon nitrogen containing passivating and barrier coatings which are deposited in an inert gas or ammonia atmosphere.

The single and multilayer coatings taught herein are particularly useful in providing protective coatings on substrates subject to oxidation when exposed to elevated temperatures in an atmosphere containing oxygen. The choice of substrates and devices to be coated by the instant invention, however, is limited only by the need for thermal and chemical stability of the substrate at the temperature and atmosphere utilized in the present invention. Additionally, the coatings taught herein may serve as dielectric layers, doped dielectric layers to produce transistor like devices, pigment loaded binder systems containing silicon to produce capacitor and capacitor like devices, multilayer devices, 3-D devices, silicon on insulator devices, super lattice devices and the like.

As used in the present invention, the expression "ceramic-like" refers to those pyrolyzed materials which are not fully free of residual carbon and/or hydrogen but which are otherwise ceramic in character; the expression "planarizing coating" refers to a coating which provides a surface barrier layer that is less irregular than the surface prior to application of the coating; the expressions "electronic device" or "electronic circuit" include, but are not limited to silicon based devices, gallium arsenide based devices, focal plane arrays, opto-electronic devices, photovoltaic cells and optical devices; and the expression "hydrolyzed or partially hydrolyzed" is used to designate a silane or mixture of silanes which have been treated with aqueous, basic or acidic conditions so as to hydrolyze either all or a portion of the hydrolyzable substituents on the silane.

In the present invention, the first ceramic or ceramic-like layer may be formed by a process which comprises coating the substrate with a solution comprising a solvent and one or more preceramic materials selected from the group consisting of H-resin and hydrolyzed or partially hydrolyzed $R_xSi(OR)_{4-x}$ wherein R is independently selected from the group consisting of alkyl, aryl and unsaturated hydrocarbons and x is 0–2. The solvent is evaporated leaving a preceramic coating deposited on the substrate. The coated substrate is then heated to a temperature of between about 500 to about 1000° C. in an inert gas atmosphere to form the coating.

The preceramic materials which are useable in the invention include hydrogen silsesquioxane resin (H-resin), $R_xSi(OR)_{4-x}$, or combinations of any of the above materials wherein R is an alkyl of 1–20 carbon atoms such as methyl, ethyl, propyl etc., an aryl such as phenyl, or an unsaturated hydrocarbon such as vinyl or allyl and x is 0–2. H-resin can be formed by the process of Frye et al. in U.S. Pat. No. 3,615,272, which is incorporated herein by reference. This material has the basic structure $(HSiO_{3/2})_n$ wherein n is generally 10–1000. The resin has a number average molecular weight of from about 800–2900 and a weight average molecular weight of between about 8000–28,000. When ceramified, this material yields a ceramic or ceramic-like coating essentially free of Si—H bonds.

Compounds of the formula $R_xSi(OR)_{4-x}$ can be divided into 2 distinct types. The first type includes compounds in which the silicon is substituted by groups other than the hydrolyzable substituents, i.e. x is 1–2. These compounds form ceramic or ceramic-like coatings containing residual 'R'. Compounds wherein x=2 are generally not used alone as cyclic structures are generated during pyrolysis, but some of said compounds may be cohydrolyzed with other preceramic compounds. Specific compounds of this first type include monomethyltriethoxysilane, monophenyltriethoxysilane, diethyldiethoxysilane, monomethyltrimethoxysilane, monophenyltrimethoxysilane and monovinyltrimethoxysilane.

The second type of compounds with the formula $R_xSi(OR)_{4-x}$ are those in which the silicon is solely bound to hydrolyzable substituents (i.e. x=0). The coatings produced by these compounds are essentially devoid of any residual organic (R) content. Examples of such compounds include, but are not limited to organic orthosilicates of the formula $Si(OR)_4$ wherein R is preferably an alkyl of 1–4 carbon atoms such as methyl, ethyl, propyl etc., an aryl such as phenyl or an unsaturated hydrocarbon radical such as vinyl or allyl. Specific compounds of the above type include tetramethoxysilane, tetraethoxysilane, tetrapropoxysilane, and tetrabutoxysilane.

Additional materials which may function equivalently, but do not fit into the above groups, include condensed esters of the formula $(RO)_3SiOSi(OR)_3$, disilanes of the formula $(RO)_xR_ySiSiR_y(OR)_x$, compounds such as SiOC wherein the carbon containing group is hydrolyzable under the thermal conditions, or any other source of SiOR.

The solvent to be utilized in the instant invention can be any agent or mixture of agents which will dissolve the preceramic material without altering the ceramic coating produced thereby. These solvents can include, for example, alcohols such as ethyl or isopropyl, aromatic hydrocarbons such as benzene or toluene, alkanes such as n-heptane or dodecane, ketones, esters or glycol ethers, in an amount sufficient to dissolve the above materials to low solids. For instance, enough of the above solvent can be included to form a 0.1–35 weight % solution.

If H-resin is utilized, the solution may be catalyzed by the simple addition of a platinum or rhodium catalyst which assists in increasing the rate and extent of ceramification. Any platinum or rhodium compound or complex which can be solubilized in this solution will be operable. For instance, an organoplatinum composition such as platinum acetylacetonate or rhodium catalyst $RhCl_3(CH_3CH_2CH_2CH_2S)_3$, obtained from Dow Corning Corporation, Midland, Mich. are all within the scope of this invention. The above catalysts are generally added to the solution in an amount of between about 15 to 200 ppm platinum or rhodium based on the weight of resin in solution.

The solution containing the preceramic material and solvent is coated onto the substrate. The method of coating can be, but is not limited to, spin coating, dip coating, spray coating or flow coating. The solvent in the solution is allowed to evaporate by drying and a preceramic coating thereby deposited. It is to be noted that when spin coating is utilized, an additional drying period is generally not necessary as the spinning tends to drive off the solvent.

The preceramic coating is ceramified to a hermetic coating by heating the coated device to 500–1000° C., preferably 600–800° C., under an inert gas atmosphere. Any method of heating such as the use of a convection oven or radiant or microwave energy is generally functional herein. Additionally, the rate of heating is generally not critical, but it is most practical and preferred to heat the substrate as rapidly as possible.

Any inert gas atmosphere such as argon or helium may be utilized in the above ceramification step. It is essential, however, to exclude air since even minor amounts of oxygen may affect the integrity of a metal.

In a typical ceramification procedure, the coated substrate may be placed in a convection oven and a continuous flow of inert gas introduced (with the exclusion of oxygen). The temperature in the oven is then raised to the desired level (such as about 600° C.) and maintained for the desired time (such as about 0.5–3 hours).

By the above method a thin (less than 2 microns) ceramic or ceramic like planarizing coating is produced on the substrate. The coating smooths the irregular surfaces of various substrates and has excellent adhesive properties. In addition, the coating may be covered by other coatings such as additional coatings as formed above, silicon containing coatings, silicon carbon containing coatings, silicon nitrogen containing coatings and/or silicon nitrogen carbon containing coatings which provide additional protection to the substrate.

In a dual layer system, the second passivation layer may comprise silicon containing coatings, silicon carbon-containing coatings, silicon nitrogen-containing coatings, silicon carbon nitrogen containing coatings or an additional coating as formed above. In a triple layer system, the second passivation layer may comprise silicon carbon-containing coatings, silicon nitrogen-containing coatings, silicon carbon nitrogen containing coatings or an additional coating as formed above and the third barrier coating may comprise silicon coatings, silicon carbon-containing coatings, silicon nitrogen-containing coatings, and silicon carbon nitrogen containing coatings.

The passivating coating may be applied by means of (i) coating the first ceramic or ceramic-like layer with a solution comprising a solvent and a preceramic polymer precursor such as polycarbosilanes, polysilazanes, organopolysilanes, silsesquiazanes, carbon substituted polysilazanes, and polysilacyclobutasilazanes (ii) evaporating said solvent to thereby deposit a preceramic polymer precursor coating on said ceramic or ceramic-like coating; and (iii) ceramifying the preceramic polymer precursor coating by heating to a temperature between 200–900° C. under an ammonia or inert gas atmosphere.

Alternatively, the passivating and/or barrier coating may be applied by the following methods. The silicon containing coating is applied by a means selected from the group consisting of (a) chemical vapor deposition of a silane, halosilane, halodisilane, halopolysilane or mixtures thereof in an inert gas atmosphere, (b) plasma enhanced chemical vapor deposition a silane, halosilane, halodisilane, halopolysilane or mixtures thereof in an inert gas atmosphere and (c) metal assisted chemical vapor deposition of a silane, halosilane, halodisilane, halopolysilane or mixture thereof in an inert gas atmosphere. The silicon carbon coating is applied by a means selected from the group consisting of (1) chemical vapor deposition in an inert gas atmosphere of a silane, alkylsilane, halosilane, halodisilane, halopolysilane or mixtures thereof in the presence of an alkane of one to six carbon atoms or an alkylsilane, (2) plasma enhanced chemical vapor deposition in an inert gas atmosphere of an alkylsilane, halosilane, halodisilane, halopolysilane or mixtures thereof in the presence of an alkane of one to six carbon atoms or an alkylsilane and (3) plasma enhanced chemical vapor deposition of a silacyclobutane or disilacyclobutane in an inert gas atmosphere. The silicon nitrogen-containing coating is deposited by a means selected from the group consisting of (A) chemical vapor deposition of a silane, halosilane, halodisilane, halopolysilane or mixtures thereof in an ammonia atmosphere, (B) plasma enhanced chemical vapor deposition of a silane, halosilane, halodisilane, halopolysilane, or mixtures thereof in an ammonia atmosphere and (C) ceramification of a silicon and nitrogen containing preceramic polymer precursor in the presence of ammonia or an inert gas atmosphere. The silicon carbon nitrogen-containing coating is deposited by a means selected from the group consisting of (i) chemical vapor deposition of hexamethyldisilazane in an ammonia or inert gas atmosphere, (ii) plasma enhanced chemical vapor deposition of hexamethyldisilazane in an ammonia or inert gas atmosphere, (iii) chemical vapor deposition of silane, alkylsilane, halosilane, halodisilane, halopolysilane or mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or mixture thereof in the presence of an alkane of one to six carbon atoms or an alkylsilane and further in the presence of ammonia.

Coatings produced by the instant invention possess low defect density and are useful on electronic devices as protective coatings, as corrosion resistant and abrasion resistant coatings, as temperature and moisture resistant coatings, as dielectric layers and as a diffusion barrier against ionic impurities such as sodium and chloride.

The following non-limiting examples are included so that one skilled in the art may more readily understand the invention.

EXAMPLE 1

Hydrogen silsesquioxane resin produced by the method of Frye et al. U.S. Pat. No. 3,615,272 issued Oct. 26, 1971, was diluted to 10 weight percent in an n-heptane solution containing 60 ppm platinum as platinum 2,4-pentanedionate. A 1½ inch square copper thick film multilayer circuit board was coated with the solution and then spun at 3000 RPM for 35 seconds. The hydrogen silsesquioxane was then ceramified by placing the device in a 2 inch Lindburg furnace with an argon atmosphere, raising the temperature to 600° C. and maintaining it for 1 hour. A coating approximately 2000 angstroms thick was produced thereby. FTIR spectra showed essentially no Si—H bonds.

EXAMPLE 2

This Example teaches the application of a second coating onto the coated copper thick film multilayer circuit board of Example 1. Said coated circuit board was coated with a second preceramic polymer solution of polycarbosilane diluted to 10 weight percent in n-heptane and then spun at 3000 RPM for 35 seconds. The coated substrate was then ceramified by placing the device in a 2 inch Lindburg furnace with an ammonia atmosphere, raising the temperature to 600° C. and maintaining it for 1 hour. A ceramic coating approximately 2300 angstroms thick was thereby deposited.

EXAMPLE 3

Accuglas 305™, a preceramic polymer containing MeSi $(OH)_x(OEt)_y$ diluted to 10 weight percent in ethanol, was used to coat a 1½ inch square copper thick film multilayer circuit board and the circuit board was then spun at 3000 RPM for 35 seconds. The Accuglas was ceramified by placing the device in a 2 inch Lindburg furnace with an argon atmosphere, raising the temperature to 700° C. and maintaining it for 1 hour. A green ceramic coating 3296 angstroms thick was thereby deposited. FTIR spectra showed some methyl substitution but essentially no hydroxyl groups.

EXAMPLE 4

A solution of preceramic material was manufactured by mixing 4.5 g of $MeSi(OMe)_3$, 4.0 g of IPA, 0.4 g of acetic acid and 2.5 g of water and heating the resultant solution for 30 minutes at 60–70° C. A 1½ inch square copper thick film multilayer circuit board was coated with the solution and then spun at 3000 RPM for 35 seconds. The preceramic material was then ceramified by placing the device in a 2 inch Lindburg furnace with an argon atmosphere, raising the temperature to 700° C. and maintaining it for 1 hour. A pink/gold ceramic coating 2682 angstroms thick was thereby deposited. FTIR spectra showed some methyl substitution but essentially no hydroxyl groups.

EXAMPLE 5

A solution of preceramic material was manufactured by mixing 5.04 cc of $Si(OEt)_4$, 5.04 cc of ethanol, 9.92 cc of water and 2 drops of 5% HCl, heating the resultant solution for 30 minutes at 60–70° C., and diluting the resultant solution to 3.3 weight percent solids with additional ethanol. A 1½ inch square copper thick film multilayer circuit board was coated with the solution and then spun at 3000 RPM for 35 seconds. The preceramic material was then ceramified by placing the device in a 2 inch Lindburg furnace with an argon atmosphere, raising the temperature to 700° C. and maintaining it for 1 hour. A blue/gold ceramic coating 3513 angstroms thick was thereby deposited. FTIR spectra showed essentially no hydroxyl substitution.

What is claimed is:

1. A coated electronic device formed by a method consisting essentially of:
    (A) coating the electronic device with a solution consisting essentially of a solvent and hydrogen silsesquioxane resin;
    (B) evaporating the solvent to deposit a preceramic coating on the electronic device;
    (C) heating the preceramic coating to a temperature of between about 500 up to about 800° C. under an inert gas atmosphere; and
    (D) applying a passivating coating over the coating of step (C), the passivating coating applied by means of (i) coating the electronic device having the coating of step (C) with a second solution comprising a solvent and a preceramic polymer, (ii) evaporating said solvent to thereby deposit a preceramic coating; and (iii) heating the preceramic coating to a temperature between 200–900° C. under an ammonia or inert gas atmosphere, whereby a dual layer coating is obtained on the electronic device.

2. A coated electronic device formed by a method consisting essentially of:
    (A) coating the electronic device with a solution consisting essentially of a solvent and hydrogen silsesquioxane resin;
    (B) evaporating the solvent to deposit a preceramic coating on the electronic device;
    (C) heating the preceramic coating to a temperature of between about 500 up to about 800° C. under an inert gas atmosphere;
    (D) applying a silicon containing passivating coating over the coating of step (C), said passivating coating selected from the group consisting of (i) silicon coatings, (ii) silicon carbon-containing coatings, (iii) silicon nitrogen-containing coatings, and (iv) silicon carbon nitrogen-containing coatings, wherein the silicon coating is applied by a means selected from the group consisting of (a) chemical vapor deposition of a silane, halosilane, halodisilane, halopolysilane or mixtures thereof in an inert gas atmosphere, (b) plasma enhanced chemical vapor deposition of a silane, halosilane, halodisilane, halopolysilane or mixtures thereof in an inert gas atmosphere and (c) metal assisted chemical vapor deposition of a silane, halosilane, halodisilane, halopolysilane or a mixture thereof in the presence of an inert gas, and wherein the silicon carbon-containing coating is applied by a means selected from the group consisting of (1) chemical vapor deposition in an inert gas atmosphere of a silane, alkylsilane, halosilane, halodisilane, halopolysilane or mixtures thereof in the presence of an alkane of one to six carbon atoms or an alkylsilane, (2) plasma enhanced chemical vapor deposition in an inert gas atmosphere of an alkylsilane, halosilane, halodisilane, halopolysilane or mixtures thereof in the presence of an alkane of one to six carbon atoms or an alkylsilane and (3) plasma enhanced chemical vapor deposition of a silacyclobutane or disilacyclobutane in an inert gas atmosphere; and wherein the silicon nitrogen containing coating is deposited by a means selected from the group consisting of (a') chemical vapor deposition of a silane, halosilane, halodisilane, halopolysilane or mixtures thereof in an ammonia atmosphere, (b') plasma enhanced chemical vapor deposition of a silane, halosilane, halodisilane, halopolysilane, or mixtures thereof in an ammonia atmosphere and (c') coating the coating of step (C) with a second solution comprising a solvent and a preceramic polymer, evaporating said solvent to thereby deposit a preceramic coating and heating the preceramic coating to a temperature between 200–900° C. under an ammonia or inert gas atmosphere, and wherein the silicon carbon nitrogen-containing coating is deposited by a means selected from the group consisting of (i) chemical vapor deposition of hexamethyl disilazane in an ammonia or inert gas atmosphere, (ii) plasma enhanced chemical vapor deposition of hexamethyldisilazane in an ammonia or inert gas atmosphere, (iii) chemical vapor deposition of a silane, alkylsilane, halosilane, halodisilane, halopolysilane or a mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or a mixture thereof in the presence of an alkane of one to six carbon atoms or an alkylsilane and further in the presence of ammonia, whereby a dual layer coating is obtained on the electronic device.

3. A coated electronic device formed by a method consisting essentially of:

(A) coating the electronic device with a solution consisting essentially of a solvent and hydrogen silsesquioxane resin;

(B) evaporating the solvent to deposit a preceramic coating on the electronic device;

(C) heating the preceramic coating to a temperature of between about 500 up to about 800° C. under an inert gas atmosphere;

(D) applying a passivating coating over the coating of step (C), the passivating coating applied by means of (i) coating the electronic device having the coating of step (C) with a second solution comprising a solvent and a preceramic polymer, (ii) evaporating said solvent to thereby deposit a preceramic coating; and (iii) heating the preceramic coating to a temperature between 200–900° C. under an ammonia or inert gas atmosphere; and (E) applying a silicon containing barrier coating to said passivating coating, said barrier coating selected from the group consisting of (i) silicon coatings, (ii) silicon carbon-containing coatings, (iii) silicon nitrogen-containing coatings, and (iv) silicon carbon nitrogen-containing coatings, wherein the silicon coating is applied by a means selected from the group consisting of chemical vapor deposition of a silane, halosilane, halodisilane, halopolysilane or mixtures thereof in an inert gas atmosphere, (b) plasma enhanced chemical vapor deposition of a silane, halosilane, halodisilane; halopolysilane or mixtures thereof in an inert gas atmosphere and (c) metal assisted chemical vapor deposition of asilane, halosilane, halodisilane, halopolysilane or a mixture thereof in the presence of an inert gas, and wherein the silicon carbon-containing coating is applied by a means selected from the group consisting of (1) chemical vapor deposition in an inert gas atmosphere of a silane, alkylsilane, halosilane, halodisilane, halopolysilane or mixtures thereof in the presence of an alkane of one to six carbon atoms or an alkylsilane, (2) plasma enhanced chemical vapor deposition in an inert gas atmosphere of an alkylsilane, halosilane, halodisilane, halopolysilane or mixtures thereof in the presence of an alkane of one to six carbon atoms or an alkylsilane and (3) plasma enhanced chemical vapor deposition of a silacyclobutane or disilacyclobutane in an inert gas atmosphere; and wherein the silicon nitrogen containing coating is deposited by a means selected from the group consisting of (a') chemical vapor deposition of a silane, halosilane, halodisilane, halopolysilane or mixtures thereof in an ammonia atmosphere, (b') plasma enhanced chemical vapor deposition of a silane, halosilane, halodisilane, halopolysilane, or mixtures thereof in an ammonia atmosphere and (c') coating the passivating coating with a third solution comprising a solvent and a preceramic polymer, evaporating said solvent to thereby deposit a preceramic coating and heating the preceramic coating to a temperature between 200–900° C. under an ammonia or inert gas atmosphere, and wherein the silicon carbon nitrogen-containing coating is deposited by a means selected from the group consisting of (i) chemical vapor deposition of hexamethyl disilazane in an ammonia or inert gas atmosphere, (ii) plasma enhanced chemical vapor deposition of hexamethyldisilazane in an ammonia or inert gas atmosphere, (iii) deposition of a silane, alkylsilane, halosilane, halopolysilane or a mixture thereof in the presence one to six carbon atoms or an alkylsilane and presence of ammonia, and (iv) plasma enhanced deposition of a silane, alkylsilane, halosilane halopolysilane or a mixture thereof in the presence one to six carbon atoms or an alkylsilane and presence of ammonia, whereby a multilayer coating is obtained on the electronic device.

4. A coated electronic device formed by a method consisting essentially of:

(A) coating the electronic device with a solution consisting essentially of a solvent and hydrogen silsesquioxane resin;

(B) evaporating the solvent to deposit a preceramic coating on the electronic device;

(C) heating the preceramic coating to a temperature of between about 500 up to about 800° C. under an inert gas atmosphere; (D) applying a silicon containing passivating coating to the coating of step (C), said passivating coating selected from the group consisting of (i) silicon carbon-containing coatings, (ii) silicon nitrogen-containing coatings, and (iii) silicon carbon nitrogen containing coatings, wherein the silicon carbon-containing coating is applied by a means selected from the group consisting of (1) chemical vapor deposition in an inert gas atmosphere of a silane, alkylsilane, halosilane, halodisilane, halopolysilane or mixtures thereof in the presence of an alkane of one to six carbon atoms or an alkylsilane, (2) plasma enhanced chemical vapor deposition in an inert gas atmosphere of an alkylsilane, halosilane, halodisilane, halopolysilane or mixtures thereof, in the presence of an alkane of one to six carbon atoms or an alkylsilane and (3) plasma enhanced chemical vapor deposition of a silacyclobutane or disilacyclobutane in an inert gas atmosphere; and wherein the silicon nitrogen containing coating is deposited by a means selected from the group consisting of (a') chemical vapor deposition of a silane, halosilane, halodisilane, halopolysilane or mixtures thereof in an ammonia atmosphere, (b') plasma enhanced chemical vapor deposition of a silane, halosilane, halodisilane, halopolysilane, or mixtures thereof in an ammonia atmosphere and (c') coating the first coating with a second solution comprising a solvent and a preceramic polymer, evaporating said solvent to thereby deposit a preceramic coating and heating the preceramic coating to a temperature between 200–900° C. under an ammonia or inert gas atmosphere, and wherein the silicon carbon nitrogen-containing coating is deposited by a means selected from the group consisting of (i) chemical vapor deposition of hexamethyldisilazane in an ammonia or inert gas atmosphere, (ii) plasma enhanced chemical vapor deposition of hexamethyl disilazane in an ammonia or inert gas atmosphere, (iii) chemical vapor deposition of a silane, alkylsilane, halosilane, halodisilane, halopolysilane or a mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or a mixture thereof in the presence of an alkane of one to six carbon atoms or an alkylsilane and further in the presence of ammonia, to produce the silicon containing passivating coating; and (E) applying a silicon containing barrier coating to the passivating coating, the barrier coating selected from the group consisting of (i) silicon coatings, (ii) silicon carbon-containing coatings, (iii) silicon nitrogen-containing coatings, and (iv) silicon carbon nitrogen-containing coatings, wherein the silicon coating is applied by a means selected from the group consisting of (a) chemical vapor deposition of a silane, halosilane, halodisilane, halopolysilane or mixtures thereof in an inert gas atmosphere, (b) plasma enhanced chemical vapor deposition of a silane, halosilane, halodisilane, halopolysilane or mixtures thereof in an inert gas atmosphere and (c) metal assisted chemical vapor deposition of a silane, halosilane, halodisilane, halopolysilane or a mixture thereof in the presence of an inert gas, and wherein the silicon carbon-containing coating is applied by a means selected from the group consisting of (1) chemical vapor deposition in an inert gas atmosphere of a silane, alkylsilane, halosilane, halodisilane, halopolysilane or mixtures thereof in the presence of an alkane of one to six carbon atoms or an alkylsilane, (2) plasma enhanced chemical vapor deposition in an inert gas atmosphere of an alkylsilane, halosilane, halodisilane, halopolysilane or mixtures thereof in the presence of an alkane of one to six carbon atoms or an alkylsilane and (3) plasma enhanced chemical vapor deposition of a silacyclobutane or disilacyclobutane in an inert gas atmosphere; and wherein the silicon nitrogen-containing coating is deposited by—a means selected from the group consisting of (a') chemical vapor deposition of a silane, halosilane, halodisilane, halopolysilane or mixtures thereof in an ammonia atmosphere, (b') plasma enhanced chemical vapor deposition of a silane, halosilane, halodisilane, halopolysilane, or mixtures thereof in an ammonia atmosphere and (c') coating the passivating coating with a second solution comprising a solvent and a preceramic polymer, evaporating said solvent to thereby deposit a preceramic coating and heating the preceramic coating to a temperature between 200–900° C. under an ammonia or inert gas atmosphere, and wherein the silicon carbon nitrogen-containing coating is deposited by a means selected from the group consisting of (i) chemical vapor deposition of hexamethyldisilazane in an ammonia or inert gas atmosphere, (ii) plasma enhanced chemical vapor deposition of hexamethyldisilazane in an ammonia or inert gas atmosphere, (iii) chemical vapor deposition of a silane, alkylsilane, halosilane, halodisilane, halopolysilane or a mixture thereof in the presence of an alkane of one to six carbon atoms or an alkylsilane and further in the presence of ammonia, and (iv) plasma enhanced chemical vapor deposition of a silane, alkylsilane, halosilane, halodisilane, halopolysilane or a mixture thereof in the presence of an alkane of one to six carbon atoms or an alkylsilane and further in the presence of ammonia, whereby a multilayer coating is obtained on the electronic device.

* * * * *